United States Patent [19]
Gens et al.

[11] Patent Number: 5,515,225
[45] Date of Patent: May 7, 1996

[54] INTEGRATED CIRCUIT PROTECTED AGAINST ELECTROSTATIC OVERVOLTAGES

[75] Inventors: Marc Gens, Saint Martin D'Uriage; Jean Jimenez, Voiron, both of France

[73] Assignee: SGS-Thomson Microelectronics S.A., Saint-Genis, Pouilly, France

[21] Appl. No.: 286,490

[22] Filed: Aug. 4, 1994

[30] Foreign Application Priority Data

Aug. 6, 1993 [FR] France ................................. 93 09928

[51] Int. Cl.$^6$ ................................................. H02H 9/04
[52] U.S. Cl. ............................. 361/56; 361/91; 361/111
[58] Field of Search ............................ 361/56, 91, 118, 361/90, 93, 100–101, 111, 212

[56] References Cited

U.S. PATENT DOCUMENTS

| | | |
|---|---|---|
| 4,819,047 | 4/1989 | Gilfeather et al. ................ 357/23.13 |
| 4,996,626 | 2/1991 | Say ......................................... 361/91 |
| 5,034,845 | 7/1991 | Murakami . | 
| 5,239,440 | 8/1993 | Merrill . |

FOREIGN PATENT DOCUMENTS 0148577  7/1985  European Pat. Off. ......... H02H 9/04

OTHER PUBLICATIONS

Patent Abstracts Of Japan, vol. 9, No. 53 (E-301)(1776) Mar. 7, 1985 & JP-A-59191371.

Revue Generale De L'Electricite, No. 2, Feb. 1987, Paris, FR, pp. 19–24, C. Chapron, "Les Circuits Integres Bipolaires: Comment Diminuer Leur Sensibilite Aux Decharges Electrostatiques".

*Primary Examiner*—A. D. Pellinen
*Assistant Examiner*—Michael J. Sherry
*Attorney, Agent, or Firm*—David M. Driscoll; James H. Morris

[57] ABSTRACT

A circuit protects pads of an integrated circuit having a plurality of power supply sources against electrostatic overvoltages. Each power supply is connected between a high voltage pad and a low voltage pad. Each pad of the circuit, as well as each power supply pad, is connected to the anode of a first diode having its cathode connected to a first conductive bus, and to the cathode of a second diode having its anode connected to a second conductive bus. A unidirectional clipping device is connected by its cathode to the first bus and by its anode to the second bus.

23 Claims, 2 Drawing Sheets

INTEGRATED CIRCUIT PROTECTED AGAINST ELECTROSTATIC OVERVOLTAGES

BACKGROUND OF THE INVENTION

1. Field of the Invention

Integrated circuits include various components that can be destroyed by the occurrence of overvoltages. A particular problem is the protection against electrostatic overvoltages of the terminals of integrated circuits during their final manufacturing steps or handling before mounting. These electrostatic overvoltages are, for example, caused when two pads or pins of an integrated circuit are contacted by a handling tool or the fingers of a user.

2. Discussion of the Related Art

It should be noted that protection circuits against electrostatic overvoltages must be active even if the integrated circuit is not connected and, more particularly, even if its ground terminals are not interconnected. In addition, these protection circuits against electrostatic pulses must not impair the operation of the integrated circuit once it is connected.

FIG. 1A shows a conventional protection scheme of an integrated circuit against electrostatic pulses including a single power supply source connected between a high voltage pad $VVD_1$ and a low voltage pad $VSS_1$. Each input/output pad p1-pn of the circuit is connected to a supply bus R1 connected to the high voltage pad $VDD_1$ through an insulating diode D1 having its anode connected to the pad and its cathode connected to the supply bus R1. Each pad P1-Pn is also connected to a supply bus R2 connected to pad $VSS_1$ through an insulating diode D2 having its cathode connected to the pad and its anode connected to the supply bus R2. The supply bus R1 is connected to the bus R2 through a clipping device symbolized in the form of an avalanche diode Z1 having its cathode connected to the bus R1 and its anode connected to the bus R2. Any conventional unidirectional clipping system can be used as a clipping device Z1. The clipping device Z1 has an avalanche threshold voltage higher than $VDD_1$- $VSS_1$ but, of course, lower than the value of the overvoltage against which the components of the integrated circuit are to be protected.

In practice, in integrated circuits, diodes D1, D2 and the clipping device Z1 are disposed inside the integrated circuit and buses R1 and R2 are metallizations formed on this integrated circuit. It should be noted that the surface area off the components corresponding to diodes D1 and D2 is relatively small, in contrast, to a relatively large surface area of the clipping device Z1 of the integrated circuit.

The circuit of FIG. 1A meets the requisites for protection against electrostatic pulses when the integrated circuit has a single external power supply source.

However, a drawback of the circuit of FIG. 1A is that, since each pad is connected to the high voltage supply through a forward biased diode and to the low voltage supply through a reverse biased diode, each pad cannot exceed 0.6 volt above the high voltage VDD or decrease down to −0.6 volt below the low voltage VSS (usually ground). In practice, in some cases, it is desirable that the pad voltage can exceed the highest supply voltage. For example, when an integrated circuit is in operation, if the high supply voltage is interrupted and grounded and if one of the pads is associated with a storing capacitor, this capacitor will be discharged through one of diodes D1 toward the power supply pad $VDD_1$. Also, output amplifiers can be connected to inductive loads. When overvoltages occur, they are clipped by the connection toward the high power supply terminal, which may be undesirable.

Existing integrated circuits often include a plurality of power supply sources (up to 7 in some circuits). Each of these power supply sources includes a high power supply terminal $VDD_i$ and a low power supply terminal $VSS_i$.

Conventionally, to protect a circuit having a plurality of power supply sources, the circuit of FIG. 1A is simply enlarged by duplicating it by circuits such as the circuit of FIG. 1B. Pads P1-Pn, that are part of circuit portions connected to a first power supply source $VDD_1$-$VSS_1$, are connected by the circuit of FIG. 1A. Pads Pn+1-Pn+k, that are part of circuit portions connected to a second power supply source $VDD_2$-$VSS_2$, are connected by a circuit analogous to the circuit of FIG. 1A, illustrated in FIG. 1B. This type of circuit is duplicated for each power supply source.

The use of this type of integrated circuit protection including a plurality of power supply sources has several major drawbacks.

A first drawback is that such a structure requires as many clipping devices Zi as power supply sources. However, as indicated above, these clipping devices occupy a relatively large integrated circuit surface area, which conflicts with the integrated circuit designer's desire to decrease the surface area of the integrated circuit.

A second, still more important, drawback of the simultaneous use of circuits such as those of FIGS. 1A and 1B in a same integrated circuit is that this type of protection is ineffective when an electrostatic pulse is generated between a pad P1-Pn associated with a first power supply source and a pad $P_{n+1}$-$P_{n+k}$ associated with a second power supply source. Then, current no longer flows through a clipping device to short the overload, which then propagates inside the integrated circuit and can be destroying.

SUMMARY OF THE INVENTION

Thus, an object of the present invention is to provide, for an integrated circuit with a multiplicity of power supply sources, a protection circuit that is fully effective against electrostatic pulses occurring between pads or pins, when the integrated circuit is not connected.

Another object of the invention is to provide such a protection circuit wherein the voltage of the pads can increase to a voltage higher than the highest supply voltage or decrease below the lowest supply voltage.

A further object of the present invention is to provide a protection circuit that occupies a reduced surface area.

These objects are achieved according to the invention with a circuit for protecting pads of an integrated circuit, associated with a plurality of power supply sources, against electrostatic overvoltages. Each power supply source is connected to a high voltage pad and to a low voltage pad. In this circuit, each pad of the circuit, as well as power supply pads, is connected to the anode of a first diode having its cathode connected to a first conductive bus, and to the cathode of a second diode having its anode connected to a second conductive bus; and a unidirectional clipping device is connected by its cathode to the first bus and by its anode to the second bus.

According to an embodiment of the invention, all the supply pads are connected in the way indicated above.

According to an embodiment of the invention, the high voltage pad of the highest power supply source is connected to the first bus, and the low voltage pad of the lowest power supply source is connected to the second bus.

According to an embodiment of this invention, the buses are comprised of conductive paths formed at the periphery of the integrated circuit, on the inside and on the outside of the connecting pads, respectively.

The foregoing and other objects, features, aspects and advantages of the invention will become apparent from the following detailed description of the present invention when taken in conjunction with the accompanying drawings.

BRIEF DESCRIPTION OF DRAWINGS

FIGS. 1A and 1B, taken in conjunction, represent a conventional electrostatic protection circuit for protecting pads of integrated circuits associated with two supply sources;

DETAILED DESCRIPTION

Figure 1A:
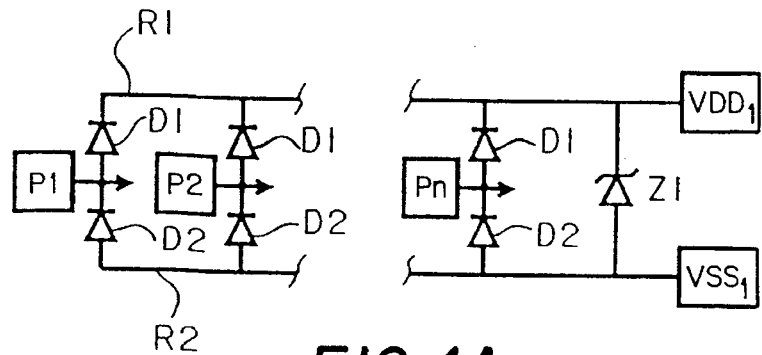
FIG. 1A represents a conventional electrostatic protection circuit for protecting pads of an integrated circuit associated with one supply source.
Figure 1B:
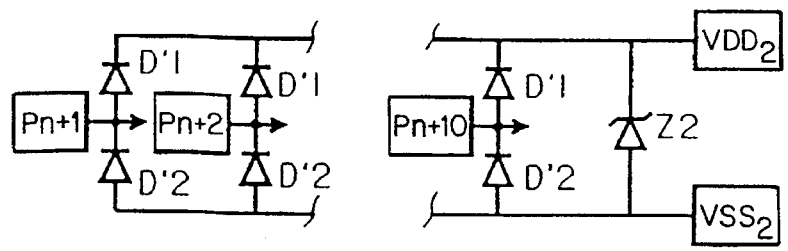
Figure 2:
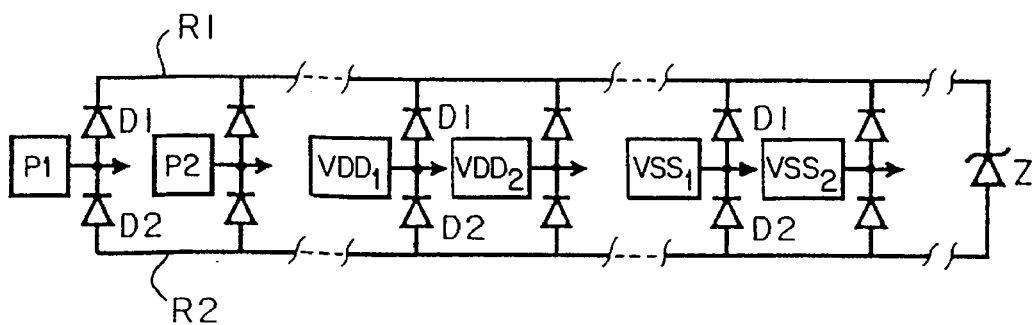
FIG. 2 represents an electrostatic protection circuit for protecting integrated circuit pads according to the invention.

FIG. 2 schematically represents an electrostatic overvoltage protection circuit according to the invention for protecting an integrated circuit associated with a plurality off power supply sources. Each power supply source is applied between a high supply terminal $VDD_1$, $VDD_2$, ... and a low supply terminal $VSS_1$, $VSS_2$, ... The integrated circuit also includes conventional input/output pads P1, P2, ... The protection circuit according to the invention includes buses R1 and R2 that are respectively connected to the cathode and to the anode of a clipping device Z. Each pad P1, P2, ... is connected to bus R1 through a forward biased diode D1 and to bus R2 through a reverse biased diode D2. In addition, according to the invention, each of the high and low power supply pads, $VDD_1$, $VDD_2$, ..., $VSS_1$, $VSS_2$, ..., respectively, is also connected to buses R1 and R2 through forward and reverse biased diodes D1 and D2, respectively. In the embodiment of FIG. 2, buses R1 and R2 are held floating.

Thus, according to the invention, an electrostatic pulse between any one of pads P1, P2, ..., and any other of these pads or any one of the high or flow power supply pads, will pass through a diode D1, the clipping device Z, and a diode D2.

Accordingly, this type of protection ensures full protection against electrostatic pulses between any pair of pads of the integrated circuit.

An advantage of the protection circuit according to the invention is that it includes a single clipping device Z disregarding the number of power supplies of the circuit. This provides a decrease in the surface area of the integrated circuit.

A further advantage of such a circuit is that the voltage of any one of pads P1, P2, ..., can, during the operation of the integrated circuit, increase to a voltage higher than the voltage of the highest power supply terminal or decrease to a voltage lower than the voltage of the lowest power supply terminal. Indeed, the voltage difference between two pads is constantly limited by the clipping voltage of the clipping device Z (plus two forward voltage drops of a diode).

Figure 3:
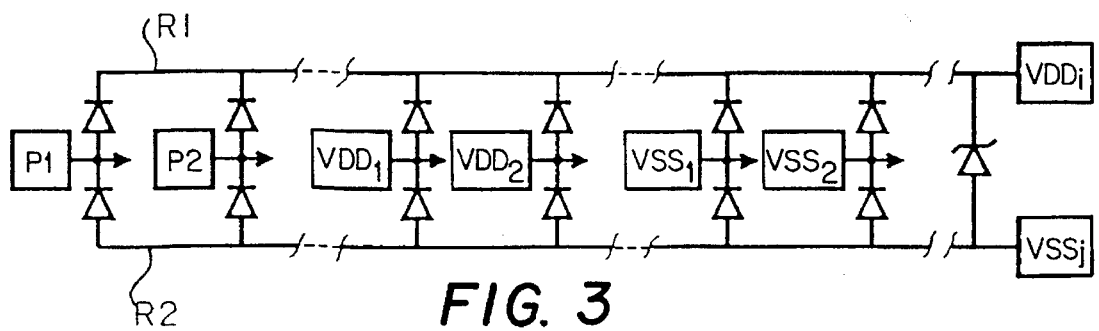
FIG. 3 represents an alternative electrostatic protection circuit for protecting integrated circuit pads according to the invention.

FIG. 3 illustrates an alternative embodiment of the invention showing substantially the same circuit as the circuit of FIG. 2 but wherein the pad to be connected to the highest supply voltage $VDD_i$ is connected to bus R1, and wherein the pad to be connected to the lowest supply voltage $VSS_j$ is connected to bus R2. This alternative embodiment also ensures protection against all the types of overvoltage, and allows, with respect to the above embodiment, to suppress four insulating diodes that would be associated, in the embodiment of FIG. 2, with pads $VDD_i$ and $VSS_j$. However, the drawback of this alternative embodiment is to prevent one of the pads P1, P2, ..., from substantially exceeding the highest voltage or from substantially decreasing below the lowest voltage.

Figure 4:
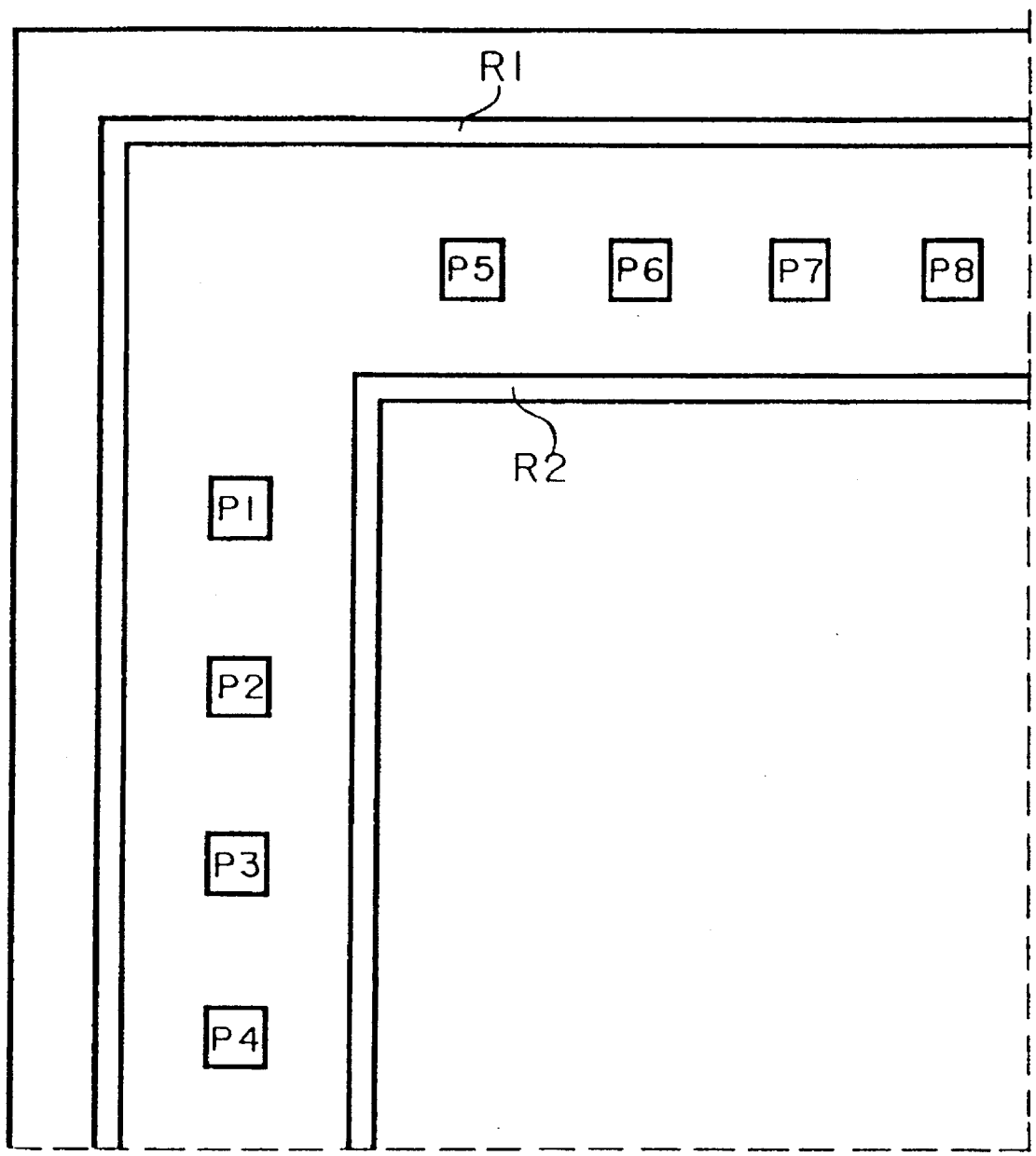
FIG. 4 schematically represents a portion of a chip of an integrated circuit incorporating an electrostatic protection circuit according to the invention.

FIG. 4 is a schematic top view off an integrated circuit portion representing pads P1–P8 that can be input/output pads or power supply pads. Conventionally, these pads are disposed at the periphery of the integrated circuit. Preferably, buses R1 and R2 are also disposed at the periphery of the integrated circuit chip, in the vicinity of the pads, on the inside and on the outside of the pads, respectively, with respect to the middle of the chip. The pads are connected to buses R1 and R2 through diodes that are conventionally incorporated in the circuit.

As is apparent to those skilled in the art, various modifications can be made to the above disclosed preferred embodiments. For example, in the case of an integrated circuit associated with a multiplicity of power supply sources in which the various sources are insulated one from the other, while having the same value, each high voltage supply pad can be coupled to the bus that is connected to the cathode of the protection circuit through a pair of parallel, head-to-tail diodes, and each low voltage pad can be coupled to the bus that is connected to the anode of the clipping device through a pair of head-to-tail diodes.

Having thus described one particular embodiment of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is not intended to be limiting. The invention is limited only as defined in the following claims and the equivalents thereto.

What is claimed is:

1. A circuit for protecting a plurality of input/output pads of an integrated circuit associated with a plurality of power supply sources against electrostatic overvoltages, each power supply source being connected to a high voltage pad and a low voltage pad, comprising:

a first conductive bus and a second conductive bus;

a plurality of first diodes coupled to the first conductive bus;

a plurality of second diodes coupled to the second conductive bus, wherein each of the plurality of input/output pads, at least one high voltage pad, and at least one low voltage pad is connected to an anode of a respective first diode having a cathode connected to the first conductive bus, and to a cathode of a respective second diode having an anode connected to the second conductive bus; and a unidirectional clipping device having an anode connected to the second conductive bus, and a cathode connected to the first conductive bus.

2. The protection circuit of claim 1, wherein the high and the low voltage pads connected to each of the plurality of power supply sources, are connected to an anode of a respective first diode having a cathode connected to the first conductive bus, and connected to a cathode of a respective second diode having an anode connected to the second conductive bus.

3. The protection circuit of claim 1, wherein a high voltage pad of a highest power supply source is connected to the first conductive bus, and a low voltage pad of a lowest power supply source is connected to the second conductive bus.

4. The protection circuit of claim 1, wherein each of the first and the second conductive buses is formed at a periphery of the integrated circuit, the input/output and voltage pads being disposed between the first and the second conductive buses.

5. A protection circuit for protecting an integrated circuit having a plurality of pads including a first circuit pad, a second circuit pad, a first voltage supply pad that connects to a first voltage supply and a second voltage supply pad that connects to the first voltage supply, the protection circuit comprising:

a first conductive path and a second conductive path;

a plurality of first diodes, a first diode being coupled between each pad and the first conductive path;

a plurality of second diodes, a second diode being coupled between each pad and the second conductive path; and a clipping circuit coupled between the first and the second conductive paths.

6. A protection circuit for protecting an integrated circuit having a plurality of pads including a first circuit pad, a second circuit pad, a first voltage supply pad that connects to a first voltage supply, and a second voltage supply pad that connects to the first voltage supply, the protection circuit comprising:

a first conductive path and a second conductive path;

a plurality of first diodes, a first diode being coupled between each pad and the first conductive path;

a plurality of second diodes, a second diode being coupled between each pad and the second conductive path; and a clipping circuit coupled between the first and the second conductive paths, wherein each diode has an anode and a cathode, each pad is coupled to the anode of the first diode that is coupled between the pad and the first conductive path;

each pad is coupled to the cathode of the second diode that is coupled between the pad and the second conductive path;

the first conductive path is coupled to the cathode of each first diode; and the second conductive path is coupled to the anode of each second diode.

7. The protection circuit of claim 6, wherein the clipping circuit includes a unidirectional clipping device having an anode and a cathode, the anode being coupled to the second conductive path, and the cathode being coupled to the first conductive path.

8. The protection circuit of claim 7, wherein the unidirectional clipping device includes a zener diode having a clipping voltage.

9. The protection circuit of claim 8, wherein each first diode has a first forward voltage drop, each second diode has a second forward voltage drop, and the protection circuit has a voltage protection threshold equal to approximately the sum of the first forward voltage drop, the second forward voltage drop and the clipping voltage.

10. The protection circuit of claim 7, wherein the first and the second conductive paths include a first terminal that connects to a second voltage supply, and a second terminal that connects to a third voltage supply, respectively to provide a first potential difference between the first and the second terminals, which is greater than a second potential difference between the first voltage supply pad and the second voltage supply pad.

11. The protection circuit of claim 7, wherein the pads and the conductive paths are disposed adjacent a periphery of the integrated circuit, and the pads are disposed between the first and the second conductive paths.

12. A protection circuit for protecting an integrated circuit having a plurality of external connecting means for establishing an external connection including first circuit means for establishing an external circuit connection, second circuit means for establishing an external circuit connection, first voltage supply means for establishing first external voltage connection to a first voltage supply and second voltage supply means for establishing a second external voltage connection to the first voltage supply, the protection circuit comprising:

first conducting means for conducting current and second conducting means for conducting current;

a plurality of first voltage controlling means for controlling voltage, a first voltage controlling means being coupled between each external connecting means and the first conducting means;

a plurality of second voltage controlling means for controlling voltage, a second voltage controlling means being coupled between each external connecting means and the second conducting means; and clipping means for clipping voltage coupled between the first and a second conducting means.

13. The protection circuit of claim 12, wherein each voltage controlling means has input means for inputting current and output means for outputting current, each external connecting means is coupled to the input means of the first voltage controlling means that is coupled between the external connecting means and the first conducting means;

each external connecting means is coupled to the output means of the second voltage controlling means that is coupled between the external connecting means and the second conducting means;

the first conducting means is coupled to each output means of each first voltage controlling means; and the second conducting means is coupled to each input means of each second voltage controlling means.

14. The protection circuit of claim 13, wherein the clipping means includes clipping input means and clipping output means, the clipping input means of the clipping means being coupled to the second conducting means, and the clipping output means of the clipping means being coupled to the first conducting means.

15. The protection circuit of claim 14, wherein the clipping means includes means for conducting current in a reverse direction so that current enters through the clipping output means and exits through the clipping input means when a voltage between the first conducting means and the second conducting means exceeds a clipping voltage.

16. The protection circuit of claim 15, wherein each first voltage controlling means has a first forward voltage drop, each second voltage controlling means has a second forward voltage drop, and the protection circuit has a voltage protection threshold equal to approximately the sum of the first forward voltage drop, the second forward voltage drop and the clipping voltage.

17. The protection circuit of claim 14, wherein the first and the second conducting means include a first terminal that connects to a second voltage supply, and a second terminal that connects to a third voltage supply, respectively, to provide a first potential difference between the first and the second terminals, which is greater than a second potential difference between the first and the second voltage supply means.

18. The protection circuit of claim 14, wherein the external connecting means and the conducting means are disposed adjacent a periphery of the integrated circuit, and the external connecting means are disposed between the first and the second conducting means.

19. A protection method for protecting an integrated circuit having a first circuit pad, a first voltage supply pad that connects to a first voltage supply, and a second voltage supply pad that connects to the first voltage supply, the method including:

draining current from the first circuit pad through a first diode, a clipping device having a clipping voltage, and a second diode, each diode having a forward bias voltage, if a potential difference between the first circuit pad and the first voltage supply pad exceeds a sum of the forward bias voltages of the first and second diodes, and the clipping voltage; and providing current to the first circuit pad through third diode, the clipping device, and a fourth diode if a potential difference between the first circuit pad and the second voltage supply pad exceeds the sum.

20. The method of claim 19, wherein the integrated circuit includes a second pad, and the method includes the step of:

draining current from the first pad and providing current to the second pad when a potential difference between the first and second circuit pads exceeds the sum.

21. The protection method of claim 19, further including the steps of:

connecting a positive terminal of a first voltage supply to the first voltage pad; and connecting a negative terminal of the first voltage supply to the second voltage pad.

22. The protection method of claim 21, further including the step of:

draining current from the first circuit pad, through the first diode, to a third voltage supply.

23. The protection method of claim 21, further including the step of:

providing current to the first circuit pad, through the second diode, from a third voltage supply.

* * * * *

UNITED STATES PATENT AND TRADEMARK OFFICE
CERTIFICATE OF CORRECTION

PATENT NO. : 5,515,225  
DATED : May 7, 1996  
INVENTOR(S) : Marc Glens and Jean Jimenez It is certified that error appears in the above-identified patent and that said Letters Patent is hereby corrected as shown below:

<u>Column 8,</u>  
Line 3, should read -- providing current to the first circuit pad through a third --

Signed and Sealed this

Twenty-fifth Day of February, 2003

JAMES E. ROGAN  
*Director of the United States Patent and Trademark Office*